(12) United States Patent
Shirai

(10) Patent No.: US 7,270,920 B2
(45) Date of Patent: Sep. 18, 2007

(54) FABRICATION METHOD OF A SEMICONDUCTOR DEVICE

(75) Inventor: Hisatsugu Shirai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 201 days.

(21) Appl. No.: 11/075,720

(22) Filed: Mar. 10, 2005

(65) Prior Publication Data
US 2006/0132776 A1   Jun. 22, 2006

(30) Foreign Application Priority Data
Dec. 21, 2004   (JP) ............................. 2004-369785

(51) Int. Cl.
*G03F 9/00* (2006.01)
*G03C 5/00* (2006.01)
(52) U.S. Cl. ......................................... 430/22; 430/30
(58) Field of Classification Search ................. 430/22, 430/30
See application file for complete search history.

(56) References Cited

U.S. PATENT DOCUMENTS 6,362,491 B1 * 3/2002 Wang et al. ................. 250/548
6,489,068 B1 * 12/2002 Kye ............................. 430/22
6,734,971 B2 * 5/2004 Smith et al. ................. 356/401
7,108,946 B1 * 9/2006 Lukanc et al. ................ 430/22

FOREIGN PATENT DOCUMENTS

JP   2001-155988   6/2001

* cited by examiner

*Primary Examiner*—Christopher G. Young
(74) *Attorney, Agent, or Firm*—Westerman, Hattori, Daniels & Adrian, LLP.

(57) ABSTRACT

A method of fabricating a semiconductor device includes an exposure step conducted by using a reticle. The method includes the steps of exposing a first pattern on a wafer by using a first reticle having a first reticle error, and exposing a second pattern on the wafer in alignment with the first pattern by using a second reticle having a second error, wherein the step of exposing the second pattern uses a reticle having a reticle error that satisfies a requirement of critical alignment error as the second reticle, the critical alignment error being determined from a design rule applied to the wafer, the critical alignment error being further determined with reference to the first reticle error of the first reticle.

8 Claims, 9 Drawing Sheets

| DAUGHTER LAYER (B) | PARENT LAYER (A) | | | |
|---|---|---|---|---|
| | ISO($\sigma a$) | M1C($\sigma c$) | M1L($\sigma d$) | M2C($\sigma e$) |
| P1L($\sigma b$) | O | | | |
| M1C($\sigma c$) | O | | | |
| M1L($\sigma d$) | | O | | |
| M2C($\sigma e$) | | | O | |
| M2L($\sigma f$) | | | | O |

FIG.8

| DAUGHTER LAYER (B) | PARENT LAYER (A) | | | | |
|---|---|---|---|---|---|
| | ISO($\sigma a$) | P1L($\sigma b$) | M1C($\sigma c$) | M1L($\sigma d$) | M2C($\sigma e$) |
| P1L($\sigma b$) | ○ | | | | |
| M1C($\sigma cx$) | | ○ | | | |
| M1C($\sigma cy$) | ○ | | | | |
| M1L($\sigma d$) | | | ○ | | |
| M2C($\sigma e$) | | | | ○ | |
| M2L($\sigma f$) | | | | | ○ |

FIG.9

| DAUGHTER LAYER (B) | PARENT LAYER (A) | | | |
|---|---|---|---|---|
| | ISO($\sigma a$) | M1C($\sigma c$) | M1L($\sigma d$) | M2C($\sigma e$) |
| P1L($\sigma b$) | ○ | | | |
| M1C($\sigma c$) | ○ | | | |
| M1L($\sigma d$) | ○(50%) | ○(50%) | | |
| M2C($\sigma e$) | | | ○ | |
| M2L($\sigma f$) | | | | ○ |

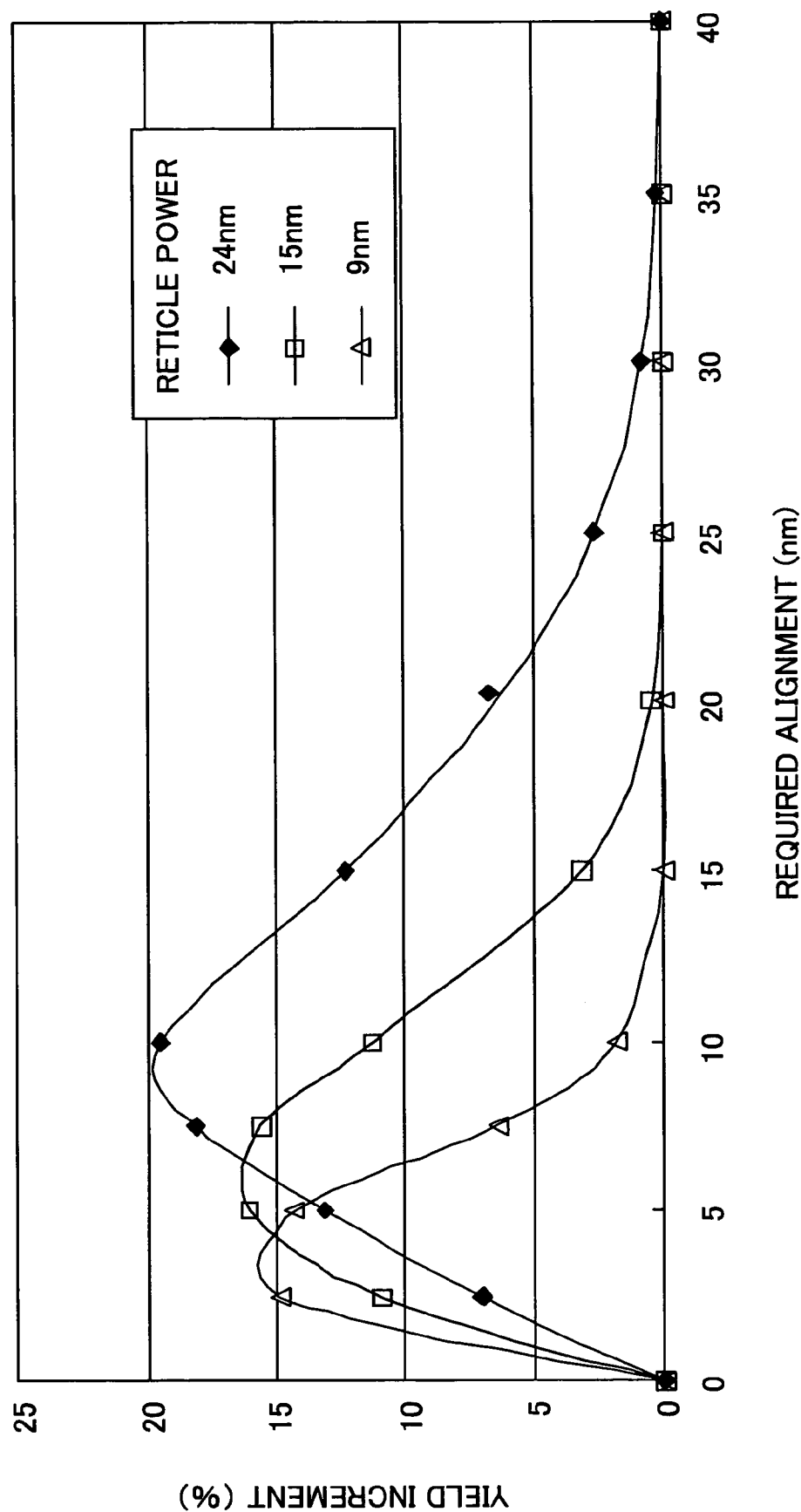

FABRICATION METHOD OF A SEMICONDUCTOR DEVICE

CROSS-REFERENCE TO RELATED APPLICATION

The present application is based on Japanese priority application No. 2004-369785 filed on Dec. 21, 2004, the entire contents of which are hereby incorporated by reference.

BACKGROUND OF THE INVENTION

The present invention generally relates to fabrication of semiconductor devices and more particularly to the fabrication process of a semiconductor device including a photolithographic process that uses a reticle.

Generally, semiconductor devices of these days are formed as a lamination of large number of patterns. Each of the pattern layers constituting the patterns is formed by a photolithographic process using a reticle, and the semiconductor devices are formed on a semiconductor wafer by repeating the process of forming a pattern layer in alignment with an underlying pattern layer.

In such a layered structure in which a large number of pattern layers are laminated, there can be caused the problem of misalignment between the patterns of different layers because of various reasons such as wafer alignment error, reticle alignment error, distortion of the exposure apparatus, aberration of the optical system used in the exposure apparatus, or the like. Thus, it is an important issue in the fabrication technology of semiconductor devices to suppress such pattern alignment error as much as possible. The total pattern alignment error caused by accumulation of various error factors is called "total overlay."

Meanwhile, the tolerable error of pattern alignment is determined primarily by the design rule of the semiconductor device. Thus, the tolerable error decreases with decreasing pattern size. In the conventional trend, the tolerable error of pattern alignment is about ⅓ times the minimum pattern size in each of the layers.

The present invention addresses the problem of the reticle error originating by the error at the time of reticle manufacture and constituting one of the foregoing factors that builds up the total overlay.

While there are various estimates about the contribution of such a reticle error, a rough estimate gives the value of about ⅙ times of the total overlay for the contribution of the reticle error to the total overlay. Thus, in the case of recent ultrafine semiconductor devices designed in accordance with the design rule of 90 nm, for example, the total overlay between adjacent layers should be about 30 nm (=90×⅓) or less, while this means that the tolerable reticle error should be about 5 nm (=30×⅙) or less. In the case of the reticles formed with four times magnification (4× reticle), the corresponding tolerable error becomes 20 nm or less.

(Patent Reference 1) Japanese Laid-Open Patent Application 2001-155988

SUMMARY OF THE INVENTION

FIG. 1 shows a typical conventional exposure process of a semiconductor device including the exposure step conducted by using a reticle.

Referring to FIG. 1, a step 1 is conducted each time a new wafer is introduced into the process, wherein it will be noted that inspection is made on the wafer thus introduced. After the step 1, a step 2 is conducted in which a resist film is coated on the wafer surface.

Further, in the step 3, a pre-baking process is applied to the resist film thus coated, and a reticle carrying a corresponding exposure pattern is mounted to an exposure apparatus.

Now, in the case the exposure to be conducted is for the exposure of second or latter layer, the process proceeds to the step 6 after judgment in a judgment step 5, and exposure is conducted in the step 7 after carrying out a wafer alignment process that achieves proper alignment between the exposure apparatus and the wafer in the foregoing step 6 by using an alignment mark.

On the other hand, in the case of carrying out exposure of the fist layer, the process jumps to the exposure step 6 directly after the judgment in the step 5.

Further, after exposure in the step 7, the resist film thus exposed is baked in the step 8, and development and rinsing process is conducted thereafter in the step 9. Further, in the step 10, the resist pattern thus developed is subjected to a post-baking process, and examination is made in the step 11 on the resist pattern thus formed on the wafer with regard to the critical dimensions (CD), alignment errors, and the like.

For those wafers that have passed the examination process of the step 11, the remaining processing of photolithography such as etching is applied in the subsequent process steps not illustrated.

Meanwhile, the reticles used with such an exposure process generally have their own reticle precision, and hence error, while such reticle error is generally determined at the time of the reticle manufacture.

Thus, in the step of mounting a reticle upon the exposure apparatus in the step 4, it is necessary to confirm whether or not the reticle to be used has necessary reticle precision and hence reticle error.

For this purpose, it has been practiced conventionally to provide a reticle discrimination step in the exposure process as shown in the step 12 for discriminating the reticles that can be used and for rejecting the reticles that cannot be used for the exposure.

FIG. 2 shows a conventional reticle discrimination process 12A conducted in correspondence to the step 12 of FIG. 1.

Referring to FIG. 2, the reticle to be used for exposure is compared in the reticle discrimination step 12A with a reference lattice provided in a standard reticle inspection apparatus, and alignment error is detected with reference to the standard lattice. The alignment error thus detected is then processed statistically, and usability of the reticle for the exposure process of the step 7 is judged based on the standard deviation value of the detected alignment errors.

FIG. 3 shows the principle of such a conventional discrimination process based on the statistical processing.

In the example of FIG. 3, a lower pattern is formed on a wafer in advance by using a reticle A having an error $\sigma a_0$ defined with reference to the reference lattice $L_0$, and a pattern of the next layer is exposed thereon by using a reticle B having an error $\sigma b_0$ defined also with reference to the foregoing reference lattice $L_0$.

In such a case, it is necessary that the relative error $\sigma ab$ between the lower exposure pattern and the upper exposure pattern has to be equal to or smaller than the tolerable error $\sigma CR$ prescribed by the design rule.

Thereby, it should be noted that there holds a relationship between the foregoing error σab and the errors σa$_0$ and σb$_0$ as:

$$\sigma ab^2 = \sigma a_0^2 + \sigma b_0^2,$$

or $$\sigma ab = \sqrt{(\sigma a_0^2 + \sigma b_0^2)}.$$

In the case the reticle A and the reticle B are manufactured with the same error, in particular, there holds the relationship $$\sigma ab = \sqrt{2}\sigma a_0 \qquad \text{Equation (1)}.$$

In such a case, it is necessary to use a reticle having the error σa$_0$ that satisfies the relationship $$\sigma ab \leq \sigma CR,$$

while this means that there should hold the relationship $$\sqrt{2}\sigma a_0 \leq \sigma CR,$$

or $$\sigma a_0 \leq 1/\sqrt{2} \times \sigma CR,$$

for the reticles A and B in order to meet for the requirement of suppressing the relative error σab to be equal to or smaller than the critical error σCR, which is imposed by the design rule.

This means that it is absolutely necessary with the conventional judgment process of FIG. 3 to use a reticle having a reticle error σa smaller than the foregoing critical error σCR by the factor of $1/\sqrt{2}$ for the exposure.

However, the use of such a standard of judgment in the discrimination step 12A of FIG. 2 raises the problem in that a large number of reticles are tend to be judged as not usable for the exposure, and the efficiency of exposure of the semiconductor device is seriously degraded. Associated with this, there arises a problem of increase of production cost of the semiconductor devices. This problem appears particularly conspicuous in recent ultrafine semiconductor devices fabricated with the design rule of 90 nm or less.

In one aspect, the present invention provides a method of fabricating a semiconductor device including an exposure step conducted by using a reticle, said method comprising the steps of:

exposing a first pattern on a wafer by using a first reticle having a first reticle error; and exposing a second pattern on said wafer in alignment with said first pattern by using a second reticle having a second error, wherein said step of exposing said second pattern uses a reticle having a reticle error that satisfies a requirement of critical alignment error as said second reticle, said critical alignment error being determined from a design rule applied to said wafer, said critical alignment error being further determined with reference to said first reticle error.

According to the present invention, the choice of reticles usable for the exposure is increased substantially, by carrying out the selection of the reticles such that the required standard of alignment error is determined with regard to the alignment error of the reticle that has been used in the previous exposure that exposes an underlying reference layer. Thereby, it becomes possible to use some of the reticles that have been rejected in the conventional selection standard, in which the comparison is made solely with reference to the reference lattice, and the yield of reticle manufacture is improved significantly together with the turnaround time of reticle manufacture. Further, the production cost of the semiconductor device fabricated by using such a reticle is suppressed also.

Other objects and further features of the present invention will become apparent from the following detailed description when read in conjunction with the attached drawings.

BRIEF DESCRIPTION OF THE DRAWINGS

FIG. 8 is a diagram showing an example of the alignment tree used with the second embodiment of the present invention;

FIG. 9 is a diagram showing an example of the alignment tree used with a third embodiment of the present invention;

FIG. 12 is another diagram showing the effect of the present invention.

DETAILED DESCRIPTION OF THE INVENTION

First Embodiment

Figure 4:
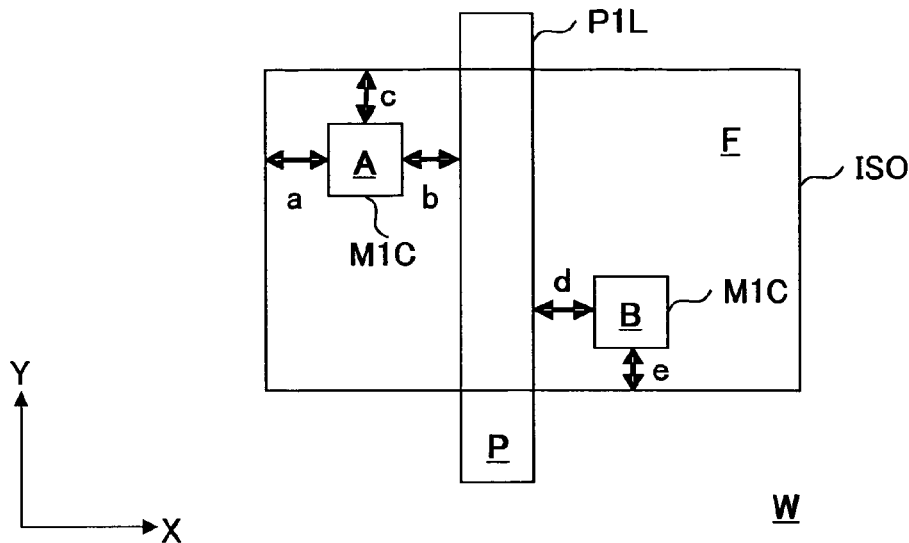
FIG. 4 is a diagram showing a first embodiment of the present invention.

FIG. 4 is a diagram showing the fabrication process of a semiconductor device according to a first embodiment, particularly for the part where an exposure process is conducted by using reticles.

Referring to FIG. 4, a device region F is formed on a wafer W, and a pattern P such as a polysilicon gate electrode pattern is formed on the wafer W in alignment with the foregoing device region F.

Further, in the state of FIG. 4, patterns A and B constituting a contact hole pattern are formed in the device region F in alignment with the device region F and further in alignment with the pattern P.

Figure 1:
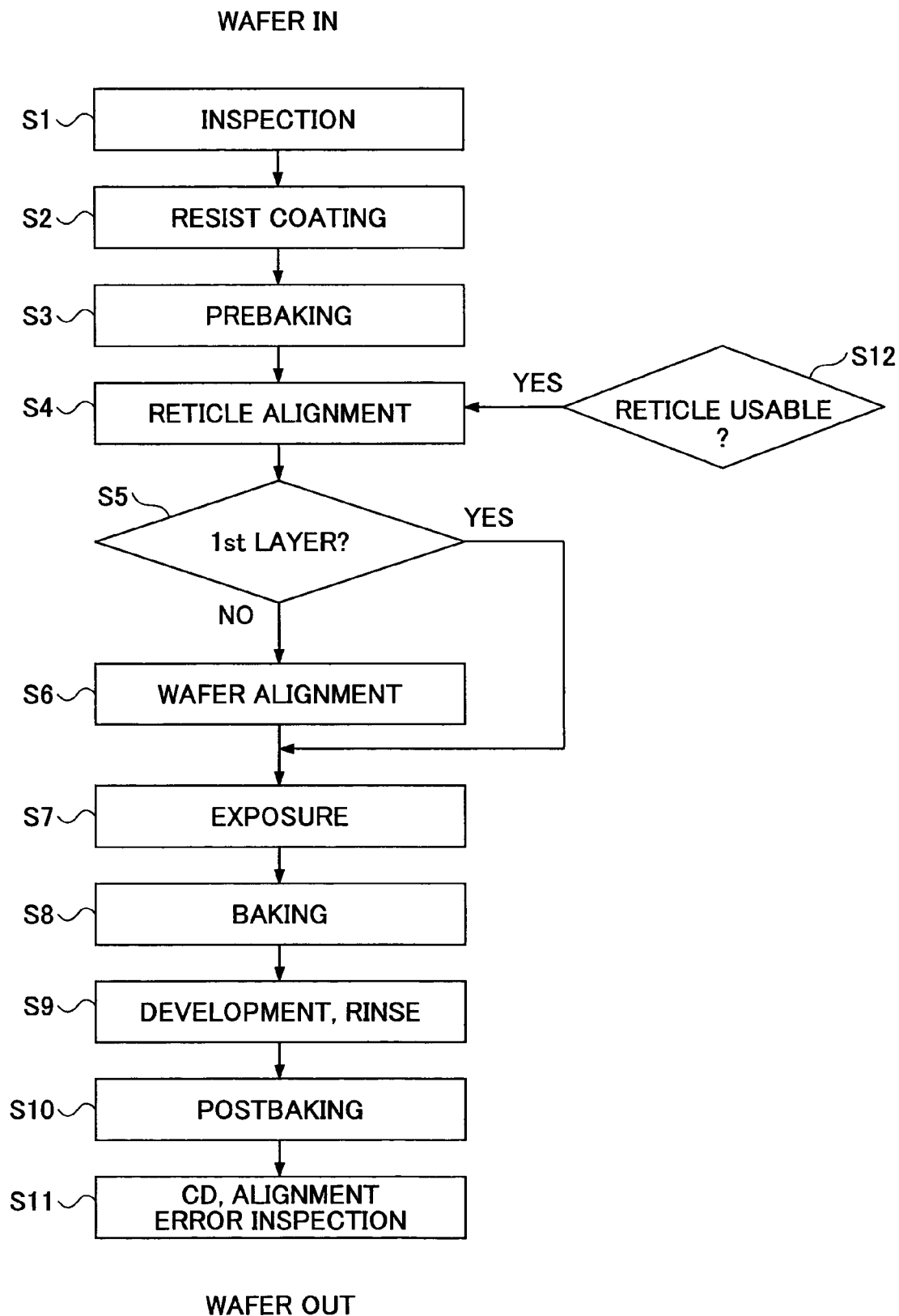
FIG. 1 is a flowchart showing a conventional fabrication process of a semiconductor device.
Figure 5:
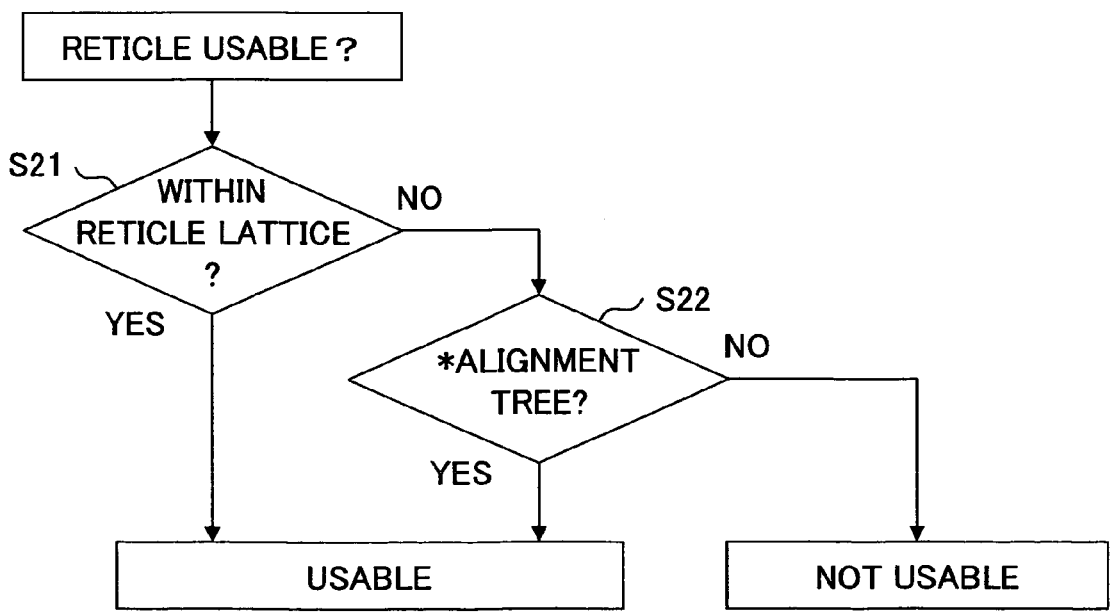
FIG. 5 is a diagram showing an example of the alignment tree according to the first embodiment of the present invention.

FIG. 5 is a flowchart showing the reticle selection process according to the first embodiment of the present invention for the case of exposing the patterns A and B in the structure of FIG. 4 by using reticles. It should be noted that the reticle selection process of FIG. 5 is used in the fabrication process of a semiconductor device of the present invention in place of the step 12 of FIG. 1.

Figure 2:
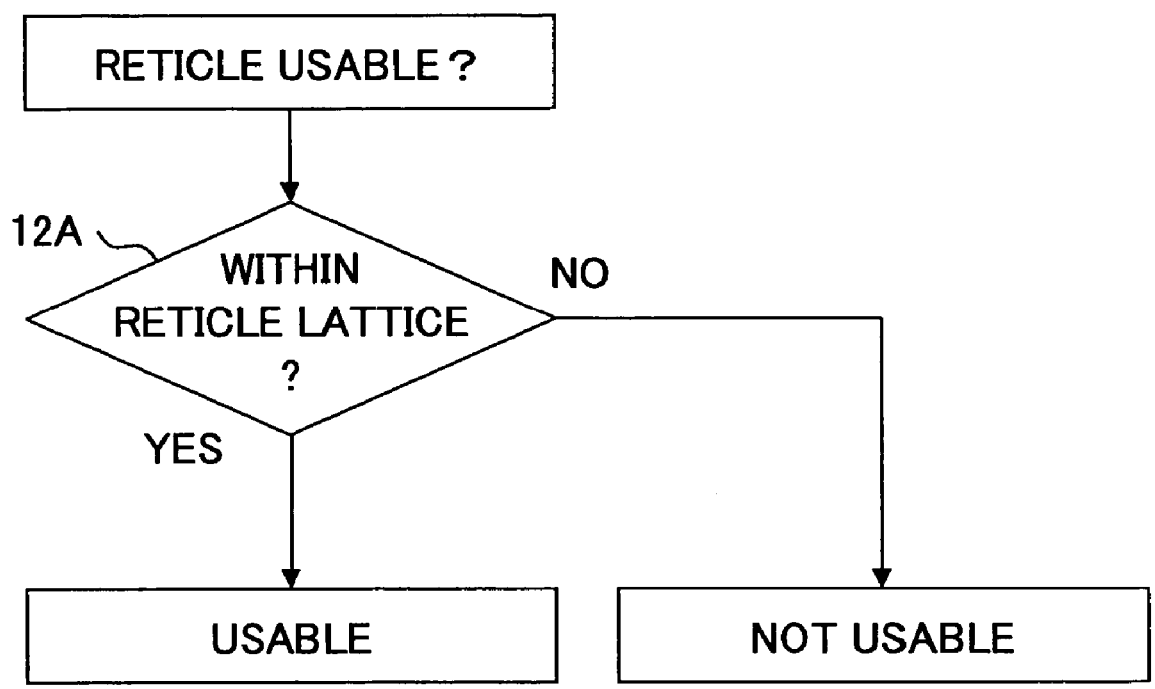
FIG. 2 is a flowchart showing a conventional discrimination process used with the process of FIG. 1 for screening usable reticles.

Referring to FIG. 5, a discrimination step corresponding to the step 12A of FIG. 2 is conducted by using a reference lattice at first, and it is judged whether or not the reticle to be used for the exposure of the patterns A and B has a necessary reticle precision or reticle error with regard to the reference lattice $L_0$.

When the result of the step 21 is YES, the reticle is of course usable for the exposure, and the reticle is mounted upon the exposure apparatus for the exposure of the patterns A and B.

On the other hand, in the case the result of the step 21 is NO, a further discrimination process 22 is conducted in the present embodiment by using an alignment tree, and usability of the reticle is decided in relation to the error of the reticle that has been used previously for exposing the underlying parent pattern F or P.

Figures 6, 7:
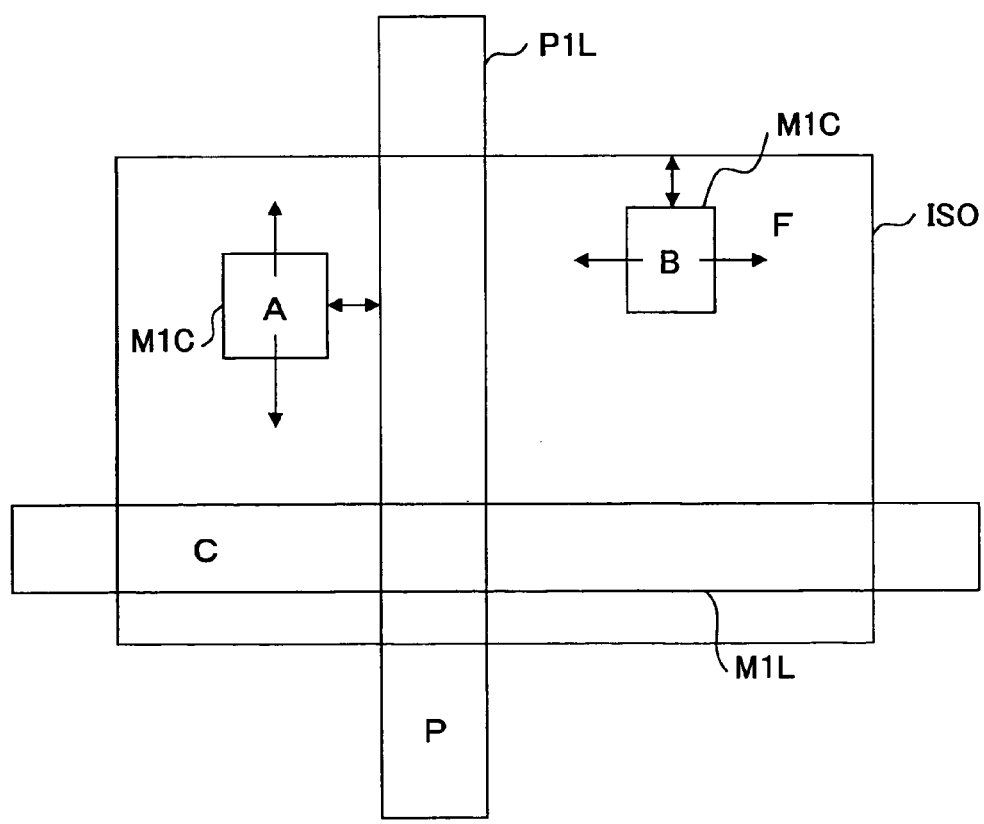
FIG. 6 is a diagram showing the process of screening usable reticles according to the first embodiment of the present invention that uses the alignment tree of FIG. 5
FIG. 7 is a diagram showing a second embodiment of the present invention.

FIG. 6 shows an example of such an alignment tree used with the first embodiment of the present invention.

Referring to FIG. 6, the alignment tree is actually a table representing the permissible combination of the reticles that have been used for exposing a parent layer such as ISO, M1C, M1L, M2C, and the like, and candidate reticles to be used for exposure of the daughter layer in alignment with the parent layer. In the illustrated example, a first reticle having an error σa is used for exposure of the lowermost layer ISO corresponding to the pattern F, and a second reticle having an error σb is used for exposing the layer P1L in alignment with the layer ISO. Further, a third reticle having an error σc is used for exposing the layer M1C corresponding to the patterns A and B in alignment with the layers ISO and P1L, and a fourth reticle having an error σd is used for exposing the layer M1L in alignment with the layer M1C. Further, a reticle having an error σe is used for exposing the layer M2C in alignment with the layer M1L, and a reticle having an error σf is used for exposing the layer M2L in alignment with the layer M2C, wherein it should be noted that the layers M1L, M2C and M2L are not shown in FIG. 4.

Here, it should be noted that these errors σa–σf represent the error of the respective reticles defined with reference to the foregoing reference lattice $L_0$ in terms of standard deviation. The foregoing error parameters σa–σf are already known for the respective reticles.

In the foregoing step 22, it should be noted that the usability of the reticles for exposure of the daughter layer is judged not from the relationship of Equation (1) explained before that uses the reference lattice $L_0$ but from the error of the reticle that has been used for exposure of the parent layer and from the critical error determined by the design rule.

In the example of FIG. 6, it should be noted that the relative error σab or σac between the pattern exposed by the reticle for exposure of the daughter layer M1C and the pattern exposed by the reticle used for the exposure of the parent layer ISO or P1L, is represented as:

$$\sigma ab^2 = \sigma a^2 + \sigma c^2,$$

or $$\sigma ac^2 = \sigma a^2 + c^2,$$

wherein σa, σb and σc represent the errors of the respective reticles. Thus, usability of the reticles is determined by comparing the foregoing relative error σab or σac with a critical error σCR, which is determined from the design rule.

Thus, in the case of exposing the daughter layer P1L in alignment with the parent layer ISO, there should hold the relationship $$\sigma ab^2 = \sigma a^2 + \sigma b^2 \leq \sigma_{CR}^2,$$

or $$\sigma ac^2 = \sigma a^2 + c^2 \leq \sigma_{CR}^2.$$

From this, it is derived that there should hold the relationship $$\sigma b^2 \leq \sigma CR^2 - \sigma a^2 \qquad \text{Equation (2),}$$

or $$\sigma c^2 \leq \sigma CR^2 - \sigma a^2 \qquad \text{Equation (3)}$$

with regard the error σb or σc.

Figure 3:
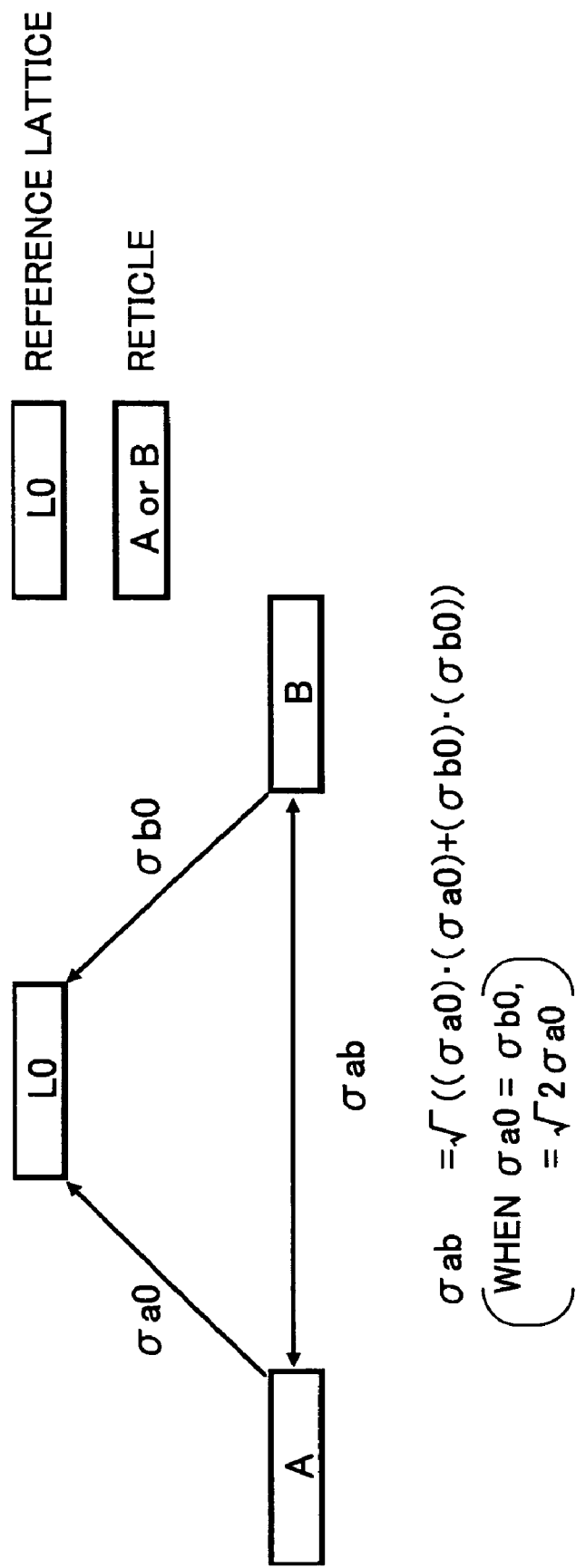
FIG. 3 is a diagram showing the principle of the conventionally used process of screening of usable reticles.

Now, it should be noted that, in the case the error σa of the reticle that has been used for exposure of the parent layer is sufficiently small, there is no longer the need of suppressing the error σb or σc to be equal to or smaller than σCR individually. Thus, the requirement imposed on the error of the reticles usable for exposure of the daughter layer P1L or M1C is relaxed substantially as compared with the conventional case explained with reference to FIG. 3.

For example, in an extreme case in which σa for the parent layer is zero, the foregoing inequalities can be written respectively as $$\sigma b \leq \sigma CR,$$

or $$\sigma c \leq \sigma CR,$$

while this means that the constraint imposed on the error of the reticles used for exposing the daughter layer is relaxed by the factor of $1/\sqrt{2}$ as compared with the case of Equation (1).

Now, it should be noted that, while such a value of the reticle error defined with reference to the reticles used for exposing the parent layer, can be obtained by using a reticle inspection device each time the reticle is to be used, it is more convenient to use the value of the reticle power (3σ value) of the respective reticles, which is provided to each of the reticles at the time of manufacture of the reticle as an index of the reticle error or precision, at the time of deciding the usability of the reticle in the step 22 of FIG. 5 as the index of the error of the reticle.

Particularly, in the case the exposure pattern of the daughter layer is similar to the exposure pattern of the parent layer, there is a tendency that relative error of the reticles is improved, and there are often the cases in which the reticle can be used for exposure of the daughter layer even in the case the result of judgment of the step 21 of FIG. 5 is NO.

By providing such a reticle selection step, choice of the reticles is increased, and it becomes possible to use those reticles that have been rejected in the conventional discrimination process such as the step 12A of FIG. 2 that relies on the comparison with the reference lattice, for the exposure of the daughter layers.

Thus, according to the present invention, the yield of reticle manufacture is improved together with the turn-around time of reticle manufacture, and the production cost of the semiconductor devices produced by using such a reticle is suppressed.

Similarly, in the alignment tree of FIG. 6, usability of the reticle for the exposure of the layer M1L is determined in relation to the reticle error σc of the reticle that has been used for exposing the corresponding parent layer M1C, usability of the reticle for the exposure of the layer M2C is determined in relation to the reticle error σd of the reticle that has been used for exposing the corresponding parent layer M1L, and usability of the reticle for the exposure of the layer M2L is determined in relation to the reticle error σe of the reticle that has been used for exposing the corresponding parent layer M2C.

Second Embodiment

Meanwhile, in such an exposure process that uses a reticle, there can be a situation shown in FIG. 7 in which a pattern A (layer M1C) is aligned with regard to the edge of a pattern P (layer P1L) that extends in the y-direction over the wafer, while a pattern B (layer M1C) is aligned with regard to the edge of the pattern F (ISO) that extends in the x-direction.

In such a case, alignment in the y-direction is not required for the pattern A, as the reference pattern B, to which the pattern A is to be aligned, extends continuously in the y-direction. Thus, alignment in the x-direction alone is important for such a pattern A. Similarly, alignment in the x-direction is not required for the pattern B, as the reference pattern F, to which the pattern B is to be aligned, extends continuously in the x-direction. Thereby, alignment in the y-direction alone is important for such a pattern B.

FIG. 8 shows an example of the alignment tree constructed for such a situation.

Referring to FIG. 8, it should be noted that the reticle for exposing the daughter layer M1C corresponding to the pattern A is aligned with reference to the device region F (layer P1L) in the x-direction, while the same reticle is aligned with the pattern F (parent layer ISO) in the y-direction. This means that, in the case of judging the usability of the reticle to be used for exposing the daughter layer M1C in relation to the error of the reticle that has been used for exposing the parent layer P1L, a weight of 100% is given to the judgment with regard to the alignment in x-direction while a weight of 0% is given to the judgment with regard to the alignment in the y-direction.

On the other hand, in the case of judging the reticle usability in relation to the parent layer ISO, a weight of 100% is given to the judgment for the alignment in the y-direction and a weight of 0% is given to the judgment for the alignment in the x-direction.

For example, the reticle used for exposing the daughter layer M1C is required to have the reticle error represented as $$\sigma cx^2 \leq \sigma CR^2 - \sigma b^2,$$

and $$\sigma cy^2 \leq \sigma CR^2 - a^2 \qquad \text{Equation (4)}$$

respectively in correspondence to Equation (2) or (3) noted before, wherein it should be noted that the foregoing Equation (4) can be generalized by using weights p and q as $$\sigma c^2 = p \cdot cx^2 + q \cdot \sigma cy^2 \leq CR^2 - p \cdot \sigma b^2 - q \cdot \sigma a^2. \qquad \text{Equation (4.1)}$$

Thus, in Equation (4.1), it is now possible to compensate for the orientation dependence of the reticle error for the alignment in the x-direction and alignment in the y-direction by introducing the probability of the patterns A and B in the form of the weights p and q.

In this way, the present embodiment judges the usability of the reticle for exposing the daughter layer M1C in relation to, or with reference to the reticle that has been used for exposing the parent layer P1L with regard to the alignment in the x-direction, while the usability of the reticle for the alignment in the y-direction is judged in relation to the reticle that has been used for exposing the parent layer ISO.

By providing such a reticle selection process, the choice of reticles is increased, and it becomes possible to save some of the reticles that would have been rejected conventionally as a result of simple comparison with the reference lattice. Thus, with the present invention, the yield of manufacture of the reticle is improved together with the turnaround time of reticle manufacture, and the production cost of semiconductor devices fabricated by using such a reticle is effectively suppressed.

Third Embodiment

FIG. 9 shows an example of the alignment tree according to a third embodiment of the present invention.

Referring to FIG. 9, the present embodiment corresponds to the case of aligning a daughter layer M1L with regard to the parent layer ISO and further the parent layer M1C, wherein it should be noted that a weight of 50% is given to the judgment with reference to the parent layer ISO, while the same weight of 50% is given to the judgment of usability with reference to the parent layer M1C. Of course, it is possible to provide different weights to the parent layers ISO and M1C.

In this case, the reticle error σd for the reticle used for exposing the daughter layer M1L should satisfy the relationship $$\sigma d^2 = w(50\%) \sigma a^2 + v(50\%) \sigma c^2 \leq \sigma CR^2 - \sigma c^2 - \sigma a^2, \qquad \text{Equation (5)}$$

wherein it should be noted that w and v represent the weight given to the judgment made with reference to the parent layer ISO and the judgment made with regard to the parent layer M1C.

With this, a reticle providing similar alignment error both with regard to the parent layer ISO and the parent layer M1C is selected for the exposure of the daughter layer M1L.

By providing such a reticle selection process, the choice of reticles is increased and it becomes possible to save some of the reticles that have been rejected in the conventional judgment process conducted based on the comparison with the reference lattice. Thus, with the present invention, the yield of reticle manufacture is improved and the turnaround time of reticle manufacture is similarly improved. Further, the production cost of the semiconductor device fabricated by using such a reticle is also suppressed.

Further, it should be noted that the foregoing relationship of the third embodiment can be expanded to the case in which there is a difference of the reticle error between the parent layer ISO and the parent layer M1C or in the case of providing different weights to different parent layers.

In such a case, the foregoing equation can be expanded to $$\sigma d^2 = w\sigma a^2 + v\sigma c^2 \leq \sigma CR^2 - m\sigma c^2 - o\sigma a^2 \text{(m and o are weights)} \qquad \text{Equation (6)}$$

Figure 10:
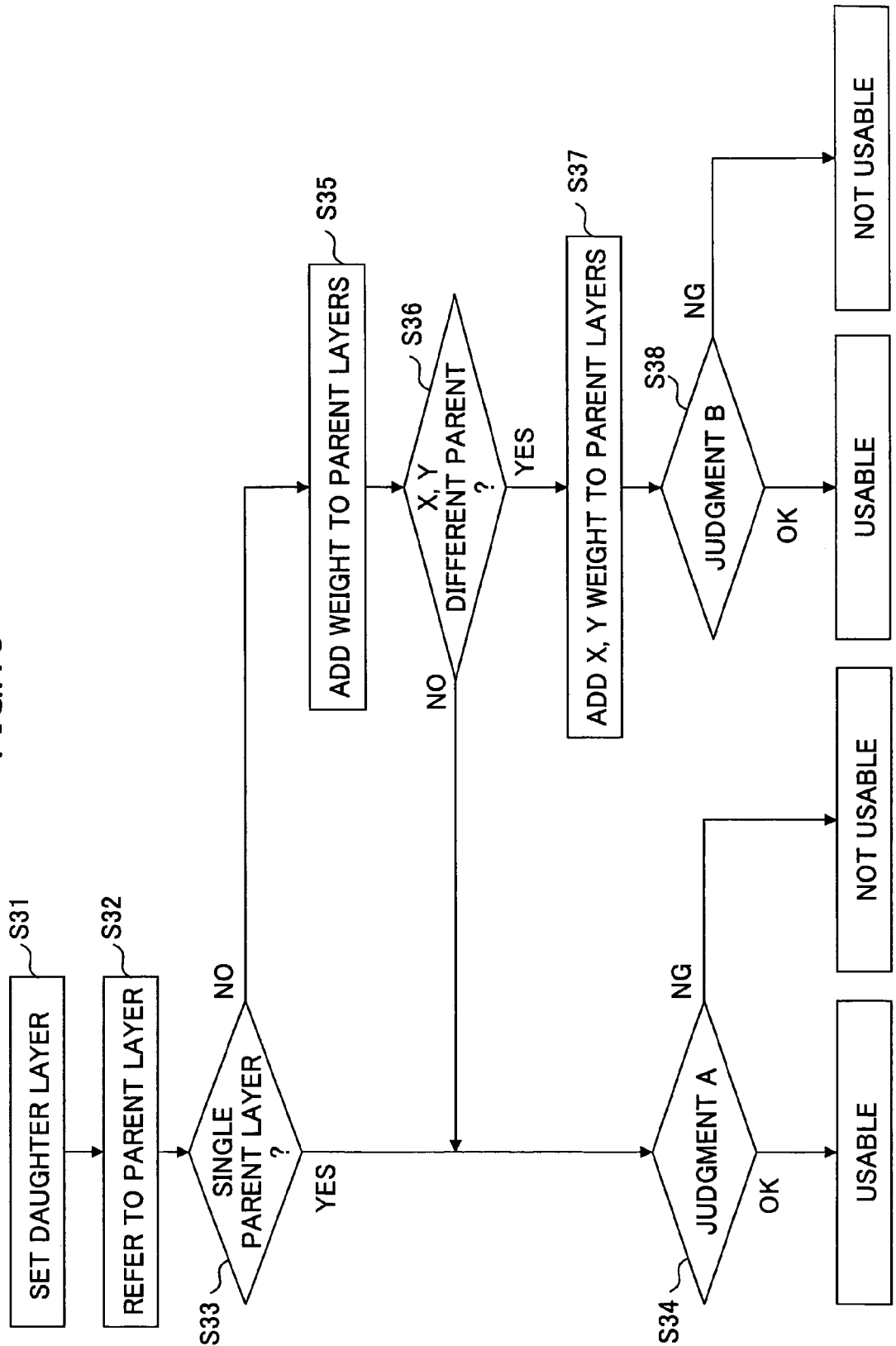
FIG. 10 is a diagram showing the process of screening usable reticles used with the third embodiment of the present invention.

FIG. 10 is a flowchart showing the reticle selection process according to a fourth embodiment of the present invention in which the alignment tree of FIG. 9 is expanded.

Referring to FIG. 10, the exposure step in the alignment tree, in other words, the exposure step to be conducted for a daughter layer, is selected in the step 31, and the parent layer corresponding to the selected daughter layer is referred to.

Next, in the step 33, judgment is made whether or not the parent layer is a single layer, and if the result is YES, the reticle error corresponding to the parent layer is obtained in the step 34 and judgment is made whether or not the obtained reticle error satisfies the precision imposed by the design rule.

In the case it is determined in the step 33 that there exist plurality of parent layers and that the daughter layer is to be aligned with regard to such plural parent layers, judgment is made in the step 36 whether or not the parent layer to be aligned in the x-direction and the parent layer to be aligned in the y-direction are the same layer.

If the result is NO, and thus, the foregoing alignment in the x-direction and the alignment in the y-direction are to be made for the same parent layer, usability of the reticle is judged in the judging step 34 noted above.

On the other hand, in the case the result of the step 36 is YES, this means that there exists a situation explained previously with reference to FIG. 8 or 9, and the foregoing σ value is calculated for each of the parent layers and for each of the x- and y-directions with respective weights, and usability of that reticle is judged in the step 38 based on the Equation (6).

Figure 11:
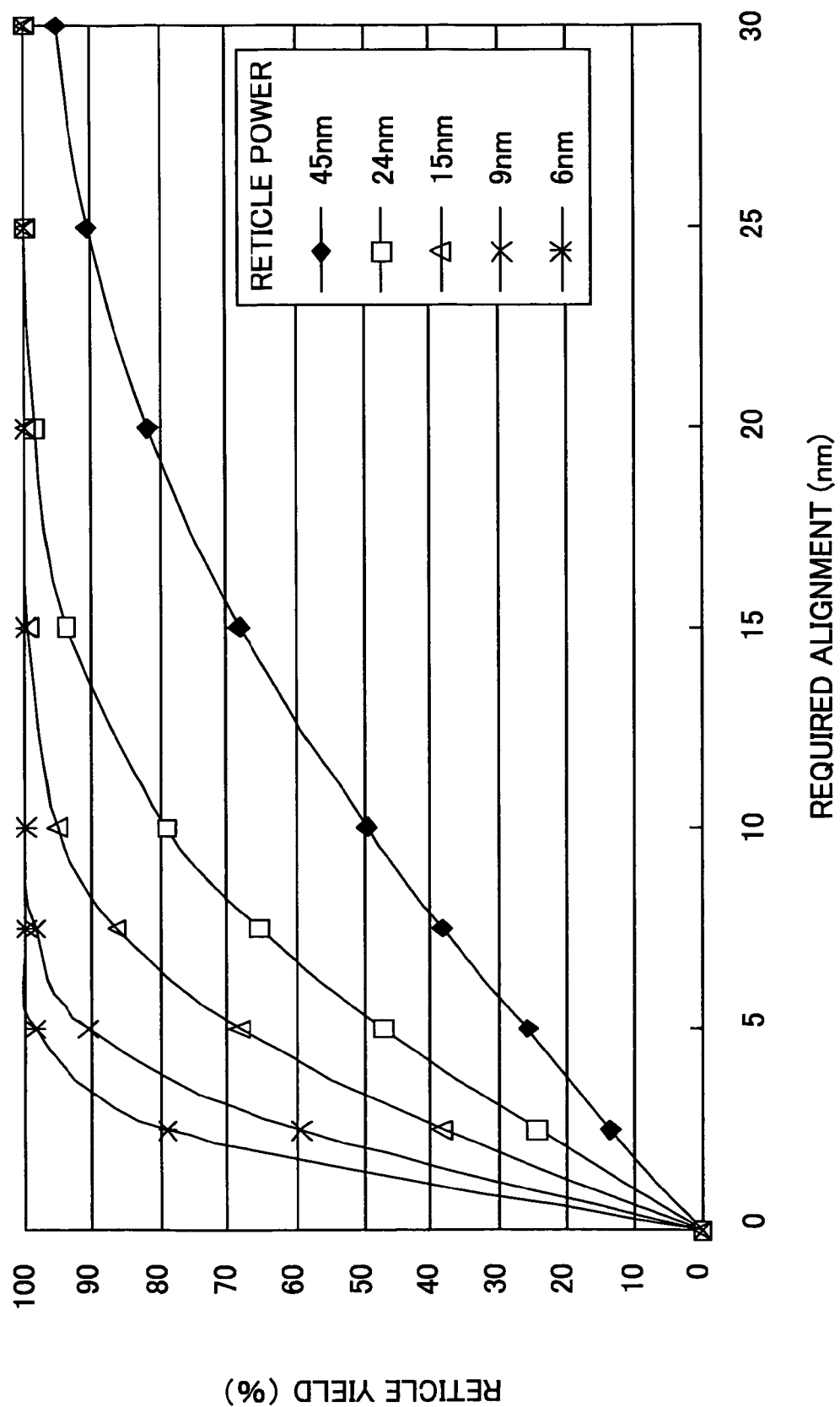
FIG. 11 is a diagram showing the effect of the present invention.

FIG. 11 shows the result of calculation of the exposure yield caused by the reticle error, and hence the reticle yield, for the case of conducting exposure with the error of 30 nm or less while using the reticles of various errors. In the drawing, "alignment power" represents the 3σ value of the reticle error.

Referring to FIG. 11, it can be seen that there occurs a drop of reticle yield with increasing demand of alignment error and that a reticle of poor precision provides low reticle yield as expected, while it should be noted the selection of usable reticles made in relation to the reticle error of the parent layer provides as in the case of the present invention provides significant improvement of the reticle yield particularly in the region where the demanded error is 30 nm or less, as represented in FIG. 12, wherein FIG. 12 shows the increment of reticle yield obtained in FIG. 11 as a result of the present invention.

Further, the present invention is not limited to he embodiments described heretofore, but various variations and modifications may be made without departing from the scope of the invention.

What is claimed is:

1. A method of fabricating a semiconductor device including an exposure step conducted by using a reticle, said method comprising the steps of:
    exposing a first pattern on a wafer by using a first reticle having a first reticle error; and
    exposing a second pattern on said wafer in alignment with said first pattern by using a second reticle having a second reticle error,
    wherein said step of exposing said second pattern uses a reticle having a reticle error that satisfies a requirement of critical alignment error as said second reticle, said critical alignment error being determined from a design rule applied to said wafer, said critical alignment error imposing a relationship between said first reticle error and said second reticle error.

2. The method as claimed in claim 1, wherein said critical alignment error is determined from a design rule with regard to a pattern distance on a wafer between said first pattern exposed by said first reticle and said second pattern exposed by said second reticle.

3. The method as claimed in claim 1, wherein said step of selecting said reticle comprises the step of calculating an error required for said second reticle from said critical alignment error and an error of said first reticle.

4. The method as claimed in claim 1, wherein said step of selecting said reticle is conducted by referring to an alignment tree, which represents a permissible combination of a reference reticle used for exposing a reference layer of alignment and a target reticle used for exposing a target layer to be aligned with said reference layer, said alignment tree representing said permissible combination for a series of reference layers and target layers in the form of a table.

5. The method as claimed in claim 1, further comprising an exposure step exposing a third pattern by using a third reticle before said step of exposing said second pattern,
    said second reticle being selected by a selection step conducted such that said second reticle satisfies said requirement of said critical alignment error with regard to said first reticle in a first direction defined on said wafer,
    said second reticle being selected by a selection step conducted such that said second reticle satisfies said requirement of said critical alignment error with regard to said third reticle in a second, different direction defined on said wafer.

6. The method as claimed in claim 1, wherein said critical alignment error has different values in a first direction defined on said wafer and in a second, different direction defined on said wafer.

7. The method as claimed in claim 1, wherein said second reticle carries thereon a first pattern element requiring alignment with a first critical alignment error on said wafer in a first direction and a second pattern element requiring alignment with a second critical alignment error in a second direction different from said first direction on said wafer,
    said second reticle being selected such that a reticle error, which is calculated by using a probability of said first pattern element and a probability of said second pattern element as a weight, satisfies said critical alignment error.

8. The method as claimed in claim 1, wherein said second reticle carries a first pattern element requiring a first critical alignment error in a first direction defined on said wafer and a second pattern element requiring a second critical alignment error in a second direction defined on said wafer, said second reticle being selected such that a collective reticle error calculated from said first and second reticle errors with respective weights added in said first and second directions satisfies said requirement of said critical alignment error.

* * * * *